(12) United States Patent
Sato

(10) Patent No.: US 11,723,198 B2
(45) Date of Patent: Aug. 8, 2023

(54) METHOD FOR MANUFACTURING SEMICONDUCTOR DEVICE

(71) Applicant: KIOXIA CORPORATION, Tokyo (JP)

(72) Inventor: Hironobu Sato, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 60 days.

(21) Appl. No.: 17/189,952

(22) Filed: Mar. 2, 2021

(65) Prior Publication Data

US 2022/0085049 A1 Mar. 17, 2022

(30) Foreign Application Priority Data

Sep. 17, 2020 (JP) ................. 2020-156082

(51) Int. Cl.
| | | |
|---|---|---|
| *H10B 43/20* | (2023.01) | |
| *H10B 41/10* | (2023.01) | |
| *H10B 41/20* | (2023.01) | |
| *H10B 41/35* | (2023.01) | |
| *H10B 43/10* | (2023.01) | |
| *H10B 43/35* | (2023.01) | |

(52) U.S. Cl.
CPC ............ *H10B 43/20* (2023.02); *H10B 41/10* (2023.02); *H10B 41/20* (2023.02); *H10B 41/35* (2023.02); *H10B 43/10* (2023.02); *H10B 43/35* (2023.02)

(58) Field of Classification Search
CPC ......... H01L 27/11578; H01L 27/11519; H01L 27/11524; H01L 27/11551; H01L 27/11565; H01L 27/1157; H01L 21/76807; H01L 2221/1047; H01L 21/02118; H01L 21/02164; H01L 21/02323; H01L 21/02337; H01L 21/76814; H01L 21/7682; H01L 21/76826; H01L 23/5329; H01L 27/11575; H01L 27/11582; H10B 43/20; H10B 41/10; H10B 41/20; H10B 41/35; H10B 43/10; H10B 43/35; H10B 43/27; H10B 43/50

See application file for complete search history.

(56) References Cited

U.S. PATENT DOCUMENTS

| | | | |
|---|---|---|---|
| 11,222,825 B2 * | 1/2022 | Staller | ............... H01L 27/11556 |
| 2006/0138404 A1 * | 6/2006 | Okada | ................. H01L 51/0537 |
| | | | 257/E21.259 |
| 2012/0241411 A1 | 9/2012 | Darling et al. | |
| 2021/0074549 A1 | 3/2021 | Sato | |

\* cited by examiner

*Primary Examiner* — Shahed Ahmed
*Assistant Examiner* — Khatib A Rahman
(74) *Attorney, Agent, or Firm* — Kim & Stewart LLP

(57) ABSTRACT

According to one or more embodiments, a method for manufacturing a semiconductor device includes alternately stacking a first film and a second film on an object to form a multilayer film, then forming a stacked body and a recess by partially removing the multilayer film. A dielectric layer is then formed by applying a composite material to the recess to fill the recess with the dielectric layer. The composite material includes an inorganic material and an organic material. The dielectric layer is then exposed to an oxidizing gas to oxidize the inorganic material and to remove at least part of the organic material from the dielectric layer.

10 Claims, 14 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2020-156082, filed Sep. 17, 2020, the entire contents of which are incorporated herein by reference.

FIELD

Embodiments described herein relate generally to a method for manufacturing a semiconductor device.

BACKGROUND

A semiconductor device such as a three-dimensional memory is known. There is a need for a method of manufacturing a semiconductor device of high reliability.

DETAILED DESCRIPTION

Figure 1:
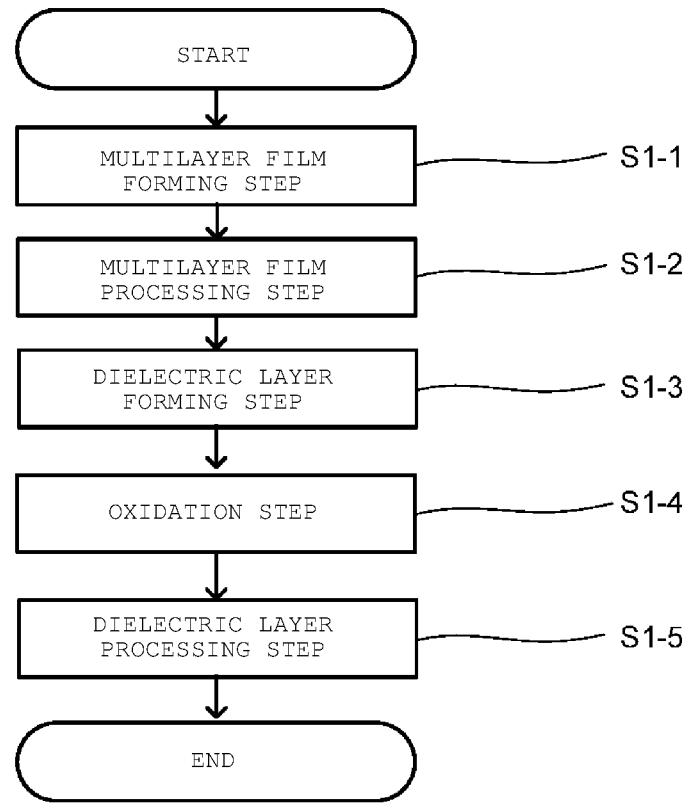
FIG. 1 is a flowchart of an example of a method for manufacturing a semiconductor device according to an embodiment.

According to one or more embodiments, a method for manufacturing a semiconductor device includes: alternately stacking a first film and a second film on an object to form a multilayer film, forming a stacked body and a recess portion by partially removing the multilayer film, forming a dielectric layer by applying a composite material to the recess portion, the recess portion being filled with the dielectric layer, the composite material including an inorganic material and an organic material, and then exposing the dielectric layer to an oxidizing gas to oxidize the inorganic material and to remove at least part of the organic material from the dielectric layer.

Hereinafter, certain example embodiments will be described with reference to the accompanying drawings. The depicted relationships between a thickness of each component and a plane dimension shown in the drawings, the ratio of the thickness of each component, or the like may differ from that of an actual product. Further, in the example embodiments, the same components or substantially the same are designated by the same reference symbols, and the descriptions thereof may be omitted as appropriate for subsequent drawings and/or description.

First Embodiment

FIG. 1 is a flowchart of an example of a method for manufacturing a semiconductor device according to a first embodiment. The method includes a multilayer film forming step S1-1, a multilayer film processing step S1-2, a dielectric layer forming step S1-3, an oxidation step S1-4, and a dielectric layer processing step S1-5.

Multilayer Film Forming Step S1-1

Figure 2:
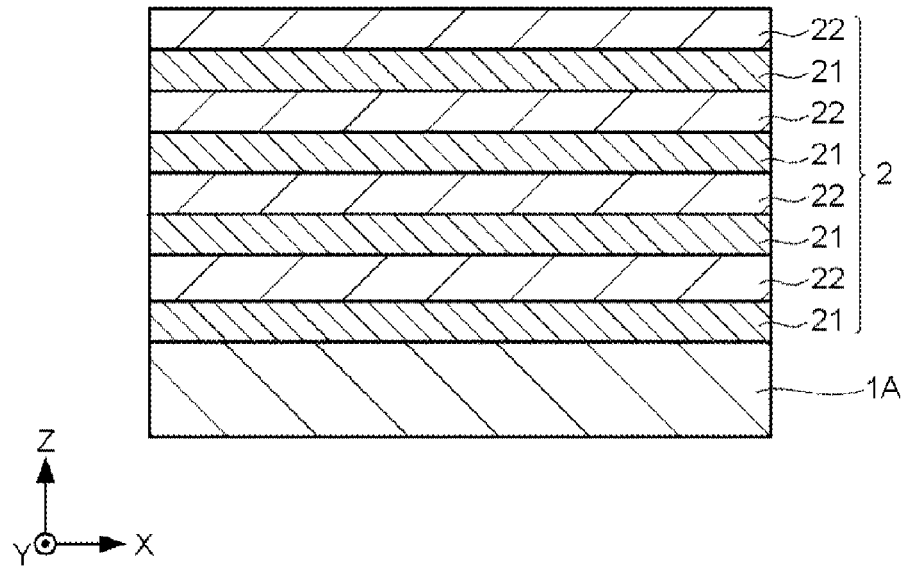
FIG. 2 depicts an example cross-section of a semiconductor device during a multilayer film forming step according to an embodiment.

FIG. 2 shows an example X-Z cross-sectional part of a semiconductor device during the multilayer film forming step S1-1. The X-Z cross-section includes an X-axis of an object 1A and a Z-axis orthogonal to both the X-axis and a Y-axis that is orthogonal to the X-axis. As shown in FIG. 2, a multilayer film 2 is formed on the object 1A by the multilayer film forming step S1-1.

The object 1A includes, for example, a semiconductor substrate such as a silicon substrate or a silicon carbide substrate, an insulating substrate such as a glass substrate, a quartz substrate, or a sapphire substrate, or a compound semiconductor substrate such as a gallium arsenide (GaAs) substrate. The object 1A may further have a layer such as an insulating layer on the substrate.

The multilayer film 2 is formed by alternately stacking a first inorganic compound film 21 and a second inorganic compound film 22 on the object 1A. The total number of the first inorganic compound films 21 and the second inorganic compound films 22 is not limited to the number shown in FIG. 2.

The first inorganic compound film 21 is a sacrificial layer. The sacrificial layer is a region for forming a cavity used to form a conductive layer. An example of the first inorganic compound film 21 includes a silicon nitride film.

The second inorganic compound film 22 is an insulating layer. An example of the second inorganic compound film 22 includes a silicon oxide film.

Multilayer Film Processing Step S1-2

Figure 3:
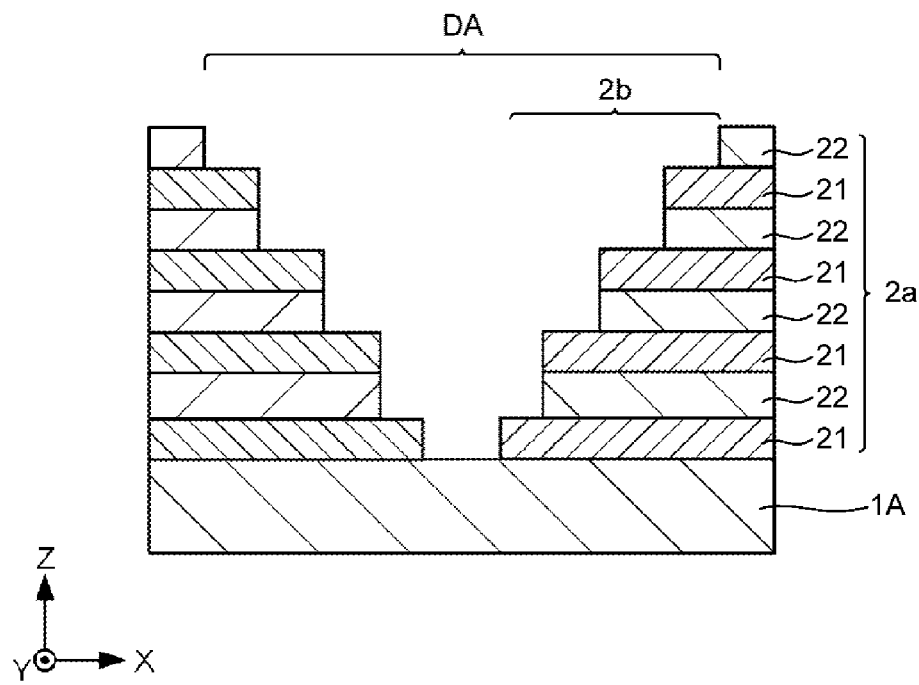
FIG. 3 depicts an example cross-section of a semiconductor device during a multilayer film processing step according to an embodiment.

FIG. 3 shows an example X-Z cross-sectional part of the semiconductor device including the object 1A during the multilayer film processing step S1-2. As shown in FIG. 3, at least one stacked body 2a of the first inorganic compound film 21 and the second inorganic compound film 22 is formed by processing the multilayer film 2 by the multilayer film processing step S1-2. A recess portion DA adjacent to the stacked body 2a is also formed. The recess portion DA is a trench in the example of FIG. 3. The present disclosure is not limited to this, and a hole may be formed as another example of the recess portion DA.

The stacked body 2a has a stair region 2b facing the recess portion DA. In the stair region 2b, an end portion of an upper surface of each of the first inorganic compound films 21 exposes. The stair region 2b is formed, for example, by forming a resist mask on the multilayer film 2 and alternately switching a step of partially removing the first inorganic compound film 21 and the second inorganic compound film 22 by anisotropic etching and a step of reducing the resist mask by isotropic etching.

Figure 4:
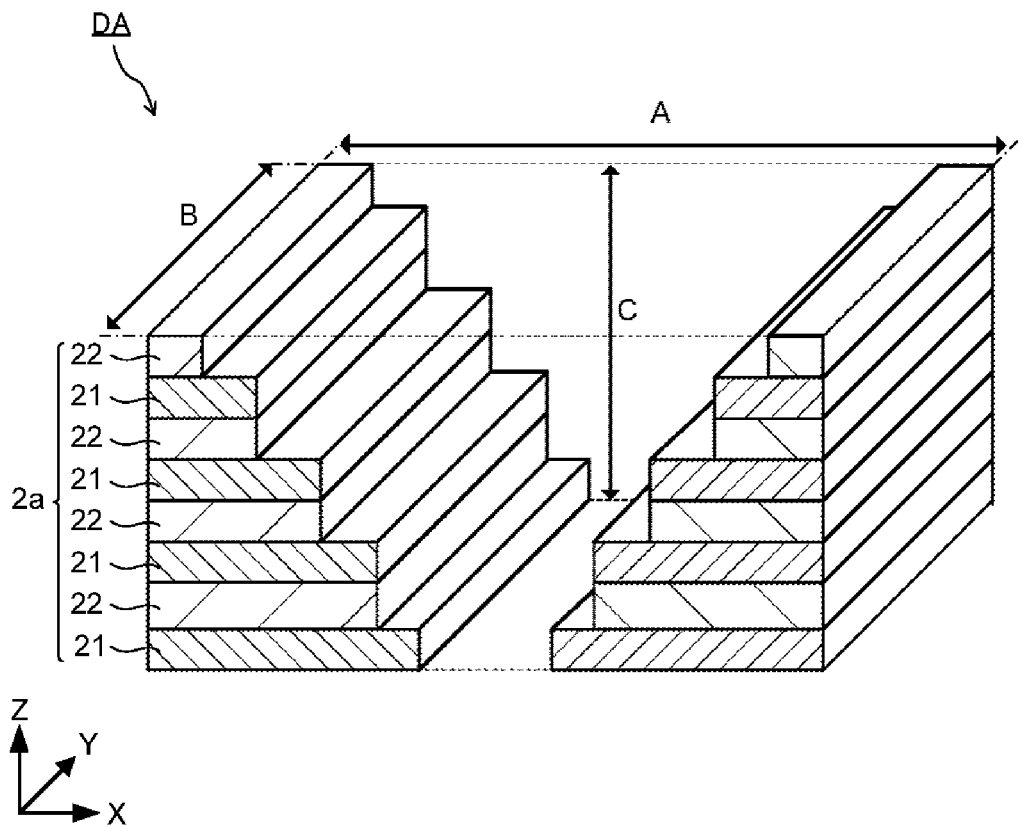
FIG. 4 depicts an example aspect ratio of a recess portion in a schematic view according to an embodiment.

The recess portion DA has a high aspect ratio of 0.6 or more, for example. FIG. 4 shows an example aspect ratio of the recess portion DA with a length A of the recess portion DA in an X-axis direction (a long axis direction), a length (or a width) B of the recess portion DA in a Y-axis direction (a short axis direction), and a length (or a depth) C of the recess portion DA in a Z-axis direction. The aspect ratio of the recess portion DA is defined by a ratio of length C to length A.

Dielectric Layer Forming Step S1-3

Figure 5:
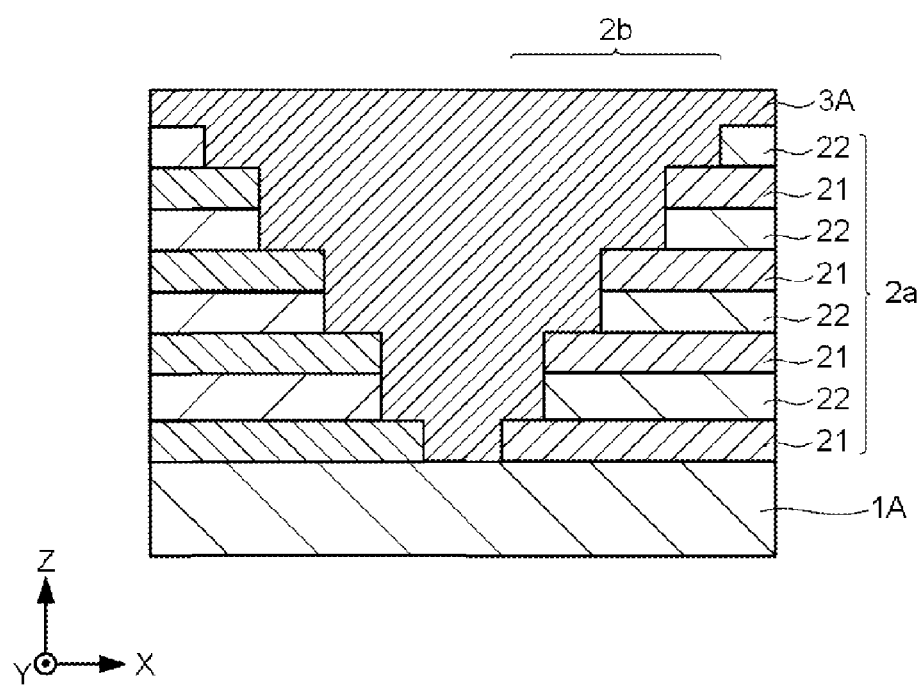
FIG. 5 depicts an example cross-section of a semiconductor device during a dielectric layer forming step according to an embodiment.

FIG. 5 shows an example X-Z cross-sectional part of the semiconductor device including the object 1A during the dielectric layer forming step S1-3. As shown in FIG. 5, a dielectric layer 3A, with which the recess portion DA is filled, is formed by the dielectric layer forming step S1-3.

Figure 6:
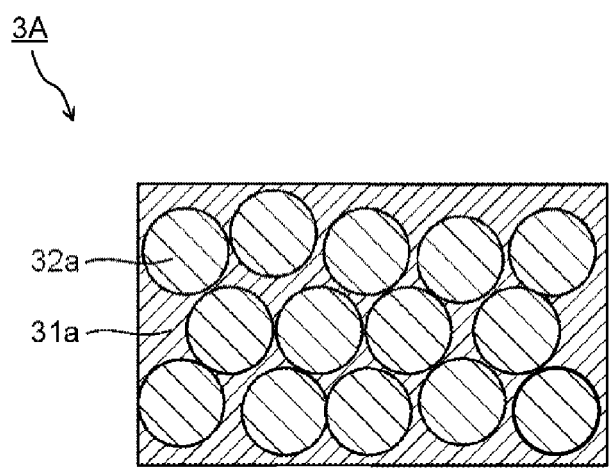
FIG. 6 depicts an example part of a dielectric layer in a dielectric layer forming step in an enlarged schematic view according to an embodiment.

FIG. 6 shows an example part of the dielectric layer 3A in the dielectric layer forming step S1-3 in an enlarged schematic view. The dielectric layer 3A includes an organic material 31a and an inorganic material 32a. The dielectric layer 3A is formed by applying or coating a composite material including the organic material 31a and the inorganic material 32a on a surface of the stacked body 2a and the recess portion DA and then flattening the coating layer by a reflow process. The use of the composite material makes it unnecessary to add a step of impregnating the dielectric layer 3A with the inorganic material 32a.

The organic material 31a is, for example, a polymer material containing carbon and oxygen. The organic material 31a has a reaction site capable of reacting with the inorganic material 32a. The reaction site capable of reacting with the inorganic material 32a includes an unshared electron pair in which, for example, the inorganic material 32a can be coordinated, an unshared electron pair, for example, present in a functioning group such as a carbonyl group or an amide group contained in a polymer, or the like.

With respect to the dielectric layer 3A, the first inorganic compound film 21 and the second inorganic compound film 22 have fewer reaction sites than the dielectric layer 3A or have no reaction sites.

The inorganic material 32a contains at least one inorganic element selected from a group consisting of, for example, silicon, titanium, tungsten, hafnium, zirconium, and aluminum, and is particularly preferably containing silicon.

Oxidation Step S1-4

Figure 7:
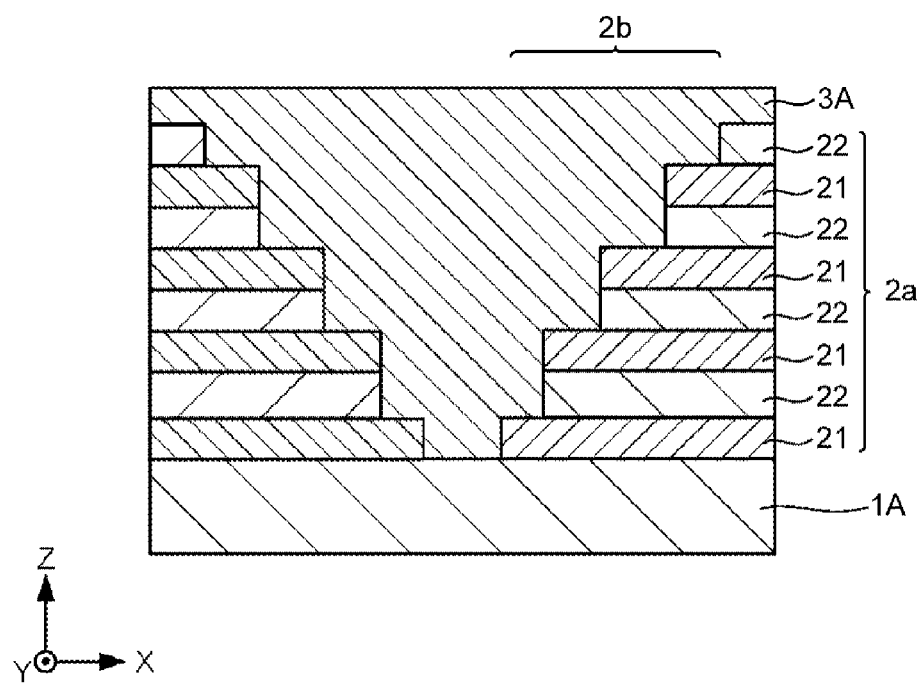
FIG. 7 depicts an example cross-section of a semiconductor device during an oxidation step according to an embodiment.
Figure 8:
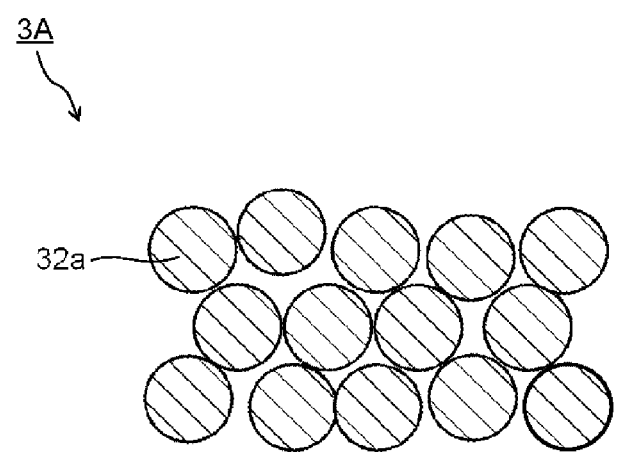
FIG. 8 depicts an example part of a dielectric layer in an oxidation step S1-4 in an enlarged schematic view according to an embodiment.

FIG. 7 shows an example X-Z cross-sectional part of the semiconductor device including the object 1A during the oxidation step S1-4. FIG. 8 shows an example part of the dielectric layer 3A in the oxidation step S1-4 in an enlarged schematic view. The dielectric layer 3A is exposed to oxidizing gas by the oxidation step S1-4. The oxidizing gas is exhausted after exposure.

The organic material 31a in the dielectric layer 3A has a reaction site that reacts with the inorganic material 32a. By exposing the dielectric layer 3A to the oxidizing gas, the oxidizing gas oxidizes the inorganic material 32a to form an oxide of the inorganic material 32a. For example, if the inorganic material 32a contains silicon, a silicon oxide film is formed. Binding energy of Si2p of the silicon oxide film at this time is, for example, 103.5 eV (±0.06 eV).

The oxidizing gas contains, for example, ozone. Since ozone has a high oxidizing power, if the oxidizing gas contains ozone, at least part of the organic material 31a is removed by exposing the dielectric layer 3A to the oxidizing gas as shown in FIG. 8. The oxide of the inorganic material 32a that remains after the organic material 31a is removed is, for example, amorphous or crystalline.

The formation of the oxide of the inorganic material 32a and the removal of the organic material 31a increase an oxygen atom concentration of the dielectric layer 3A and an atomic concentration of silicon or metal and decrease a carbon atom concentration. The oxygen atom concentration, the carbon atom concentration, and the silicon or metal atom concentration can be measured by, for example, X-ray photoelectron spectroscopy (XPS).

In the oxidation step S1-4, the dielectric layer 3A can be formed by the oxide of the inorganic material 32a by forming the oxide of the inorganic material 32a and removing at least part of the organic material 31a. The density of the dielectric layer 3A formed by the oxidation step S1-4 is, for example, 1.9 g/cm$^3$ or more and 2.0 g/cm$^3$ or less.

Dielectric Layer Processing Step S1-5

Figure 9:
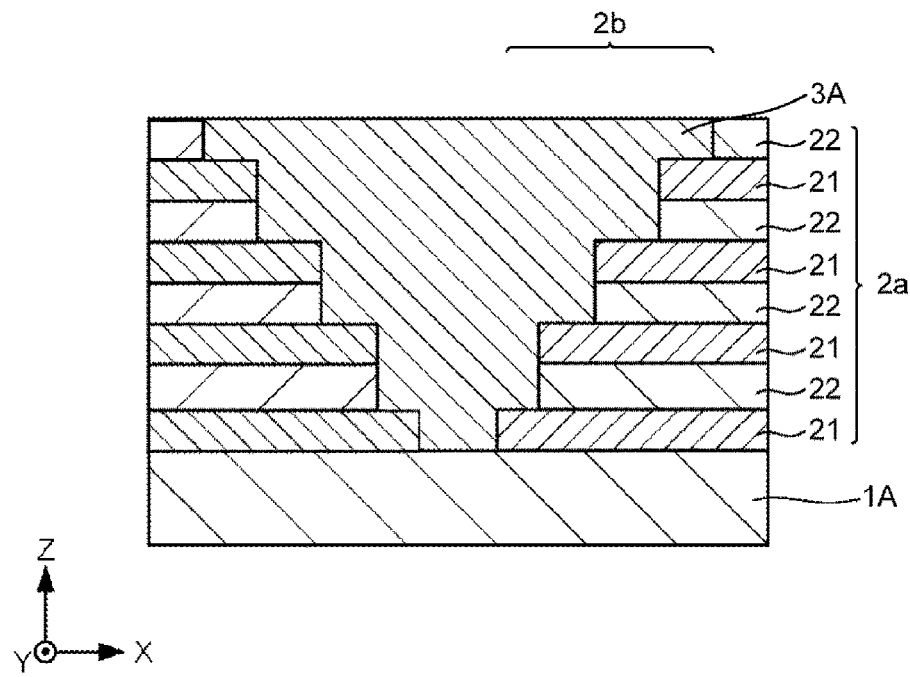
FIG. 9 depicts an example cross-section of a semiconductor device during a dielectric layer processing step according to an embodiment.

FIG. 9 shows an example X-Z cross-sectional part of the semiconductor device including the object 1A during the dielectric layer processing step S1-5. By the dielectric layer processing step S1-5, as shown in FIG. 9, the dielectric layer 3A is partially removed along a thickness direction until an upper surface of the stacked body 2a is exposed.

The dielectric layer 3A formed by the manufacturing method according to the first embodiment is applicable to a dielectric layer, for example, used for a memory such as a three-dimensional memory.

Figure 10:
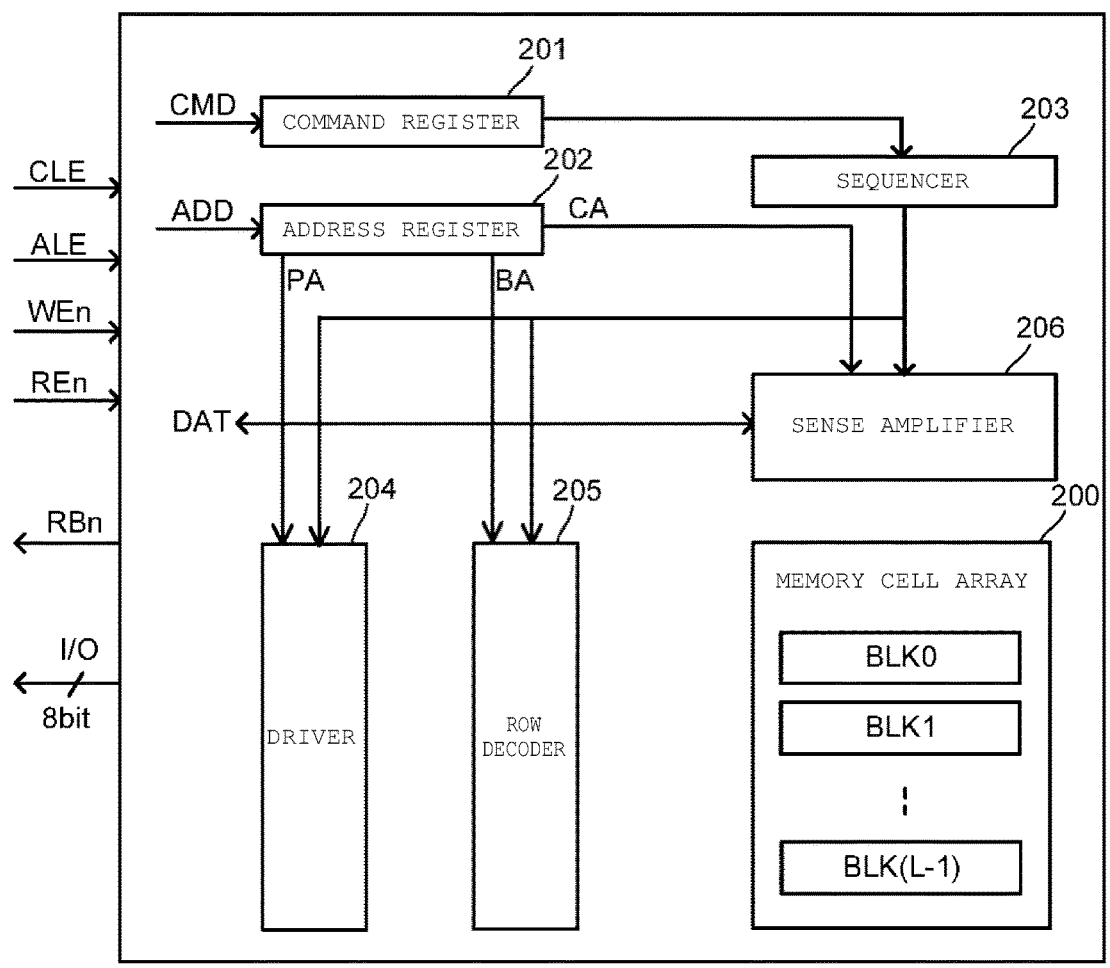
FIG. 10 is a block diagram of an example configuration of a memory according to an embodiment.

FIG. 10 is a block diagram of an example configuration of a memory according to the present embodiment. The memory includes a memory cell array 200, a command register 201, an address register 202, a sequencer 203, a driver 204, a row decoder 205, and a sense amplifier 206.

The memory cell array 200 includes a plurality of blocks BLK (or BLK0 to BLK(L−1) where L is a natural number of 2 or more). The block BLK is a set of a plurality of memory transistors MT that store data non-volatilely.

The memory cell array 200 is connected to a plurality of word lines WL and a plurality of bit lines BL. Each memory transistor MT is connected to one of the word lines WLs and one of the bit lines BLs.

The command register 201 stores a command signal CMD received from a memory controller. The command signal CMD includes, for example, instruction data that causes the sequencer 203 to execute a read operation, a write operation, and an erase operation.

The address register 202 stores an address signal ADD received from the memory controller. The address signal ADD includes, for example, a block address BA, a page address PA, and a column address CA. For example, the block address BA, the page address PA, and the column address CA are used to select the block BLK, the word line WL, and the bit line BL, respectively.

The sequencer 203 controls operations of the memory. The sequencer 203 controls the driver 204, the row decoder 205, the sense amplifier 206, and the like based on the command signal CMD stored in the command register 201 and executes operations such as the read operation, the write operation, and the erase operation.

The driver 204 generates a voltage used in the read operation, the write operation, the erase operation, and the like. The driver 204 includes, for example, a DA converter. The driver 204 applies, for example, a generated voltage to a signal line corresponding to a selected word line WL based on the page address PA stored in the address register 202.

The row decoder 205 selects one block BLK in the corresponding memory cell array 200 based on the block address BA stored in the address register 202. Then, the row decoder 205 transfers, for example, a voltage applied to the signal line corresponding to the selected word line WL to a selected word line WL in selected block BLK.

In the write operation, the sense amplifier 206 applies a desired voltage to each bit line BL according to write data DAT received from the memory controller. In the read operation, the sense amplifier 206 determines the data stored in the memory cell based on the voltage of the bit line BL and transfers the determination result as the read data DAT to the memory controller.

Communication between the memory and the memory controller supports, for example, the NAND interface standard. For example, communication between the memory and the memory controller uses a command latch enable signal CLE, an address latch enable signal ALE, a write enable signal WEn, a read enable signal REn, a ready busy signal RBn, and an input/output signal I/O.

The command latch enable signal CLE indicates that the input/output signal I/O received by the memory is the command signal CMD. The address latch enable signal ALE indicates that the received signal I/O is the address signal ADD. The write enable signal WEn instructs the memory to input the input/output signal I/O. The read enable signal REn instructs the memory to output the input/output signal I/O.

The ready busy signal RBn notifies the memory controller whether the memory is in a ready state for accepting the instruction from the memory controller or a busy state for not accepting the instruction.

The input/output signal I/O is, for example, an 8-bit wide signal and may include signals such as the command signal CMD, the address signal ADD, and the write data signal (or the write data) DAT.

A combination of the memory and the memory controller may constitute one semiconductor storage device. Examples of such s semiconductor storage device include, but are not limited to, a memory card such as an SD card, and a solid-state drive (SSD).

Figure 11:
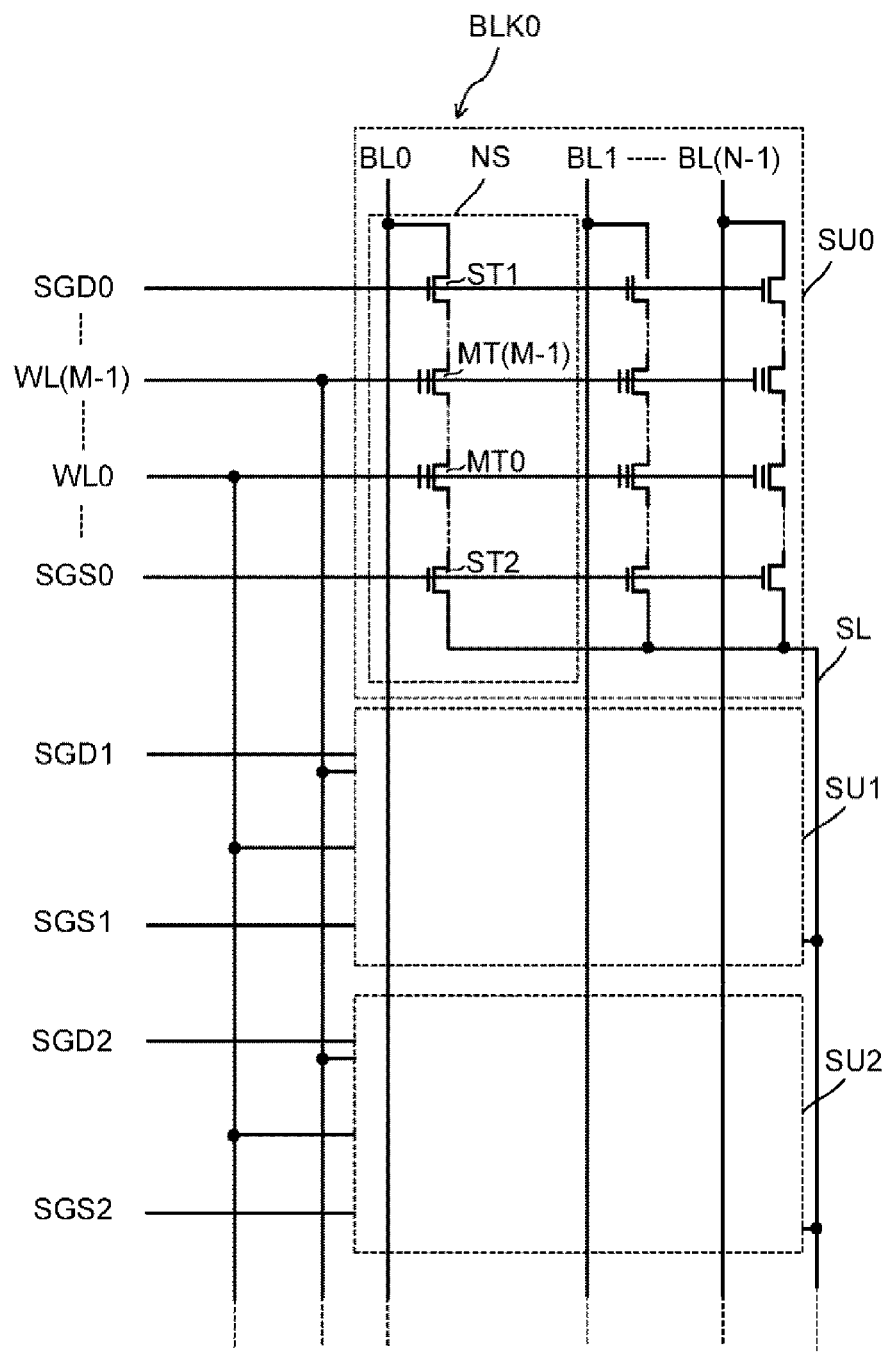
FIG. 11 is a circuit diagram of an example circuit configuration of a memory cell array according to an embodiment.

FIG. 11 is a circuit diagram of an example circuit configuration of the memory cell array 200 according to the present embodiment. In FIG. 11, the block BLK0 is shown as one example. The configuration of each of other blocks BLK1, BLK2, etc. is the same or substantially the same as that of the block BLK0.

The block BLK0 includes a plurality of string units SU. Each string unit SU includes a plurality of NAND strings NS. While there are three string units SU (that is, SU0 to SU2) in the example of FIG. 11, the number of string units SU in the block BLK0 or any other blocks BLK is not limited thereto.

Each NAND string NS is connected to one of a plurality of bit lines BL (or BL0 to BL(N−1) where N is a natural number of 2 or more). Each NAND string NS includes a plurality of memory transistors MT (or MT0 to MT(M−1) where M is a natural number of 2 or more), a select transistor ST1, and a select transistor ST2.

Each memory transistor MT includes a control gate and a charge storage layer and stores data non-volatilely. While each NAND string NS includes the plurality of memory transistors MT in the present embodiment, the number of memory transistors MT is not limited thereto. While each NAND string NS has the same or substantially the same structure as that of the memory transistor MT in the present embodiment, it may also include a dummy memory transistor that is not used for storing data.

The memory transistor MT may be a Metal-Oxide-Nitride-Oxide-Semiconductor (MONOS) type in which an insulating film is used for the charge storage layer or a Floating-Gate (FG) type in which a conductor layer is used for the charge storage layer. In the present embodiment, the memory transistor MT is the MONOS type.

The select transistor ST1 is used to select the string unit SU during various operations. The number of select transistors ST1 is not limited to that shown in FIG. 11.

The select transistor ST2 is used to select the string unit SU during various operations. The number of select transistors ST2 is not limited to that shown in FIG. 11.

In each NAND string NS, a drain of the select transistor ST1 is connected to the corresponding bit line BL. A source of the select transistor ST1 is connected to one end of the memory transistor MT connected in series. Another end of the memory transistor MT connected in series is connected to a drain of the select transistor ST2.

In the same block BLK, a source of the select transistor ST2 is connected to a source line SL. A gate of the select transistor ST1 of each string unit SU is connected to a corresponding select gate line SGD. The control gates of the memory transistors MT are respectively connected to the corresponding word lines WL. A gate of the select transistor ST2 is connected to a corresponding select gate line SGS.

The plurality of NAND strings NS to which the same column address CA is assigned are connected to the same bit line BL among the plurality of blocks BLK. The source line SL is connected between the plurality of blocks BLK.

Figure 12:
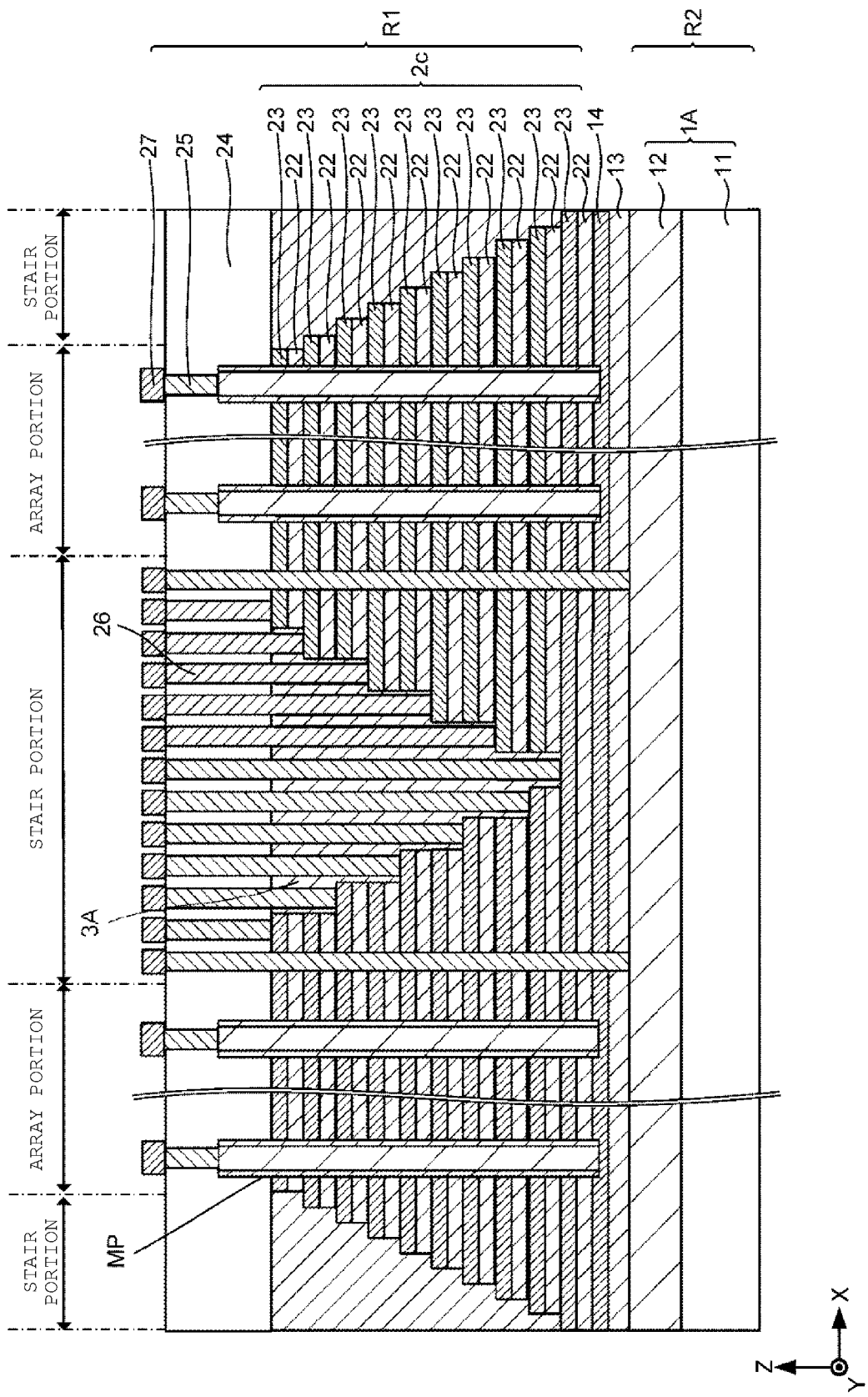
FIG. 12 depicts an example structure of a memory in a schematic sectional view according to an embodiment.

FIG. 12 shows an example structure of a memory, according to the present embodiment, in a schematic sectional view in X-Z axes direction, the X-axis being along a surface of a semiconductor substrate 11 (as the object 1A), the Y-axis being substantially perpendicular to the X-axis, and the Z-axis being substantially perpendicular to the surface of a semiconductor substrate 11.

The memory shown in FIG. 12 includes a first region R1 including the memory cell array 200 shown in FIG. 10, and a second region R2 including a peripheral circuit region 12 on the semiconductor substrate 11, which includes, below the memory cell array 200, the command register 201, the address register 202, the sequencer 203, the driver 204, the row decoder 205, the sense amplifier 206, and the like shown in FIG. 10. Not limited to this, the peripheral circuit region 12 may be juxtaposed with the memory cell array 200.

The memory further includes an insulating layer 13, a wiring layer 14, a stacked body 2c of the second inorganic compound films 22 which is an insulating layer and the wiring layers 23, an insulating layer 24, a contact layer 25, a contact layer 26, a wiring layer 27, the dielectric layer 3A, and a memory pillar MP.

The insulating layer 13 is provided on the peripheral circuit region 12. The insulating layer 13 contains, for example, silicon oxide.

The wiring layer 14 is provided on the insulating layer 13 and includes a source line SL. The wiring layer 14 contains, for example, a metal material.

Figure 13:
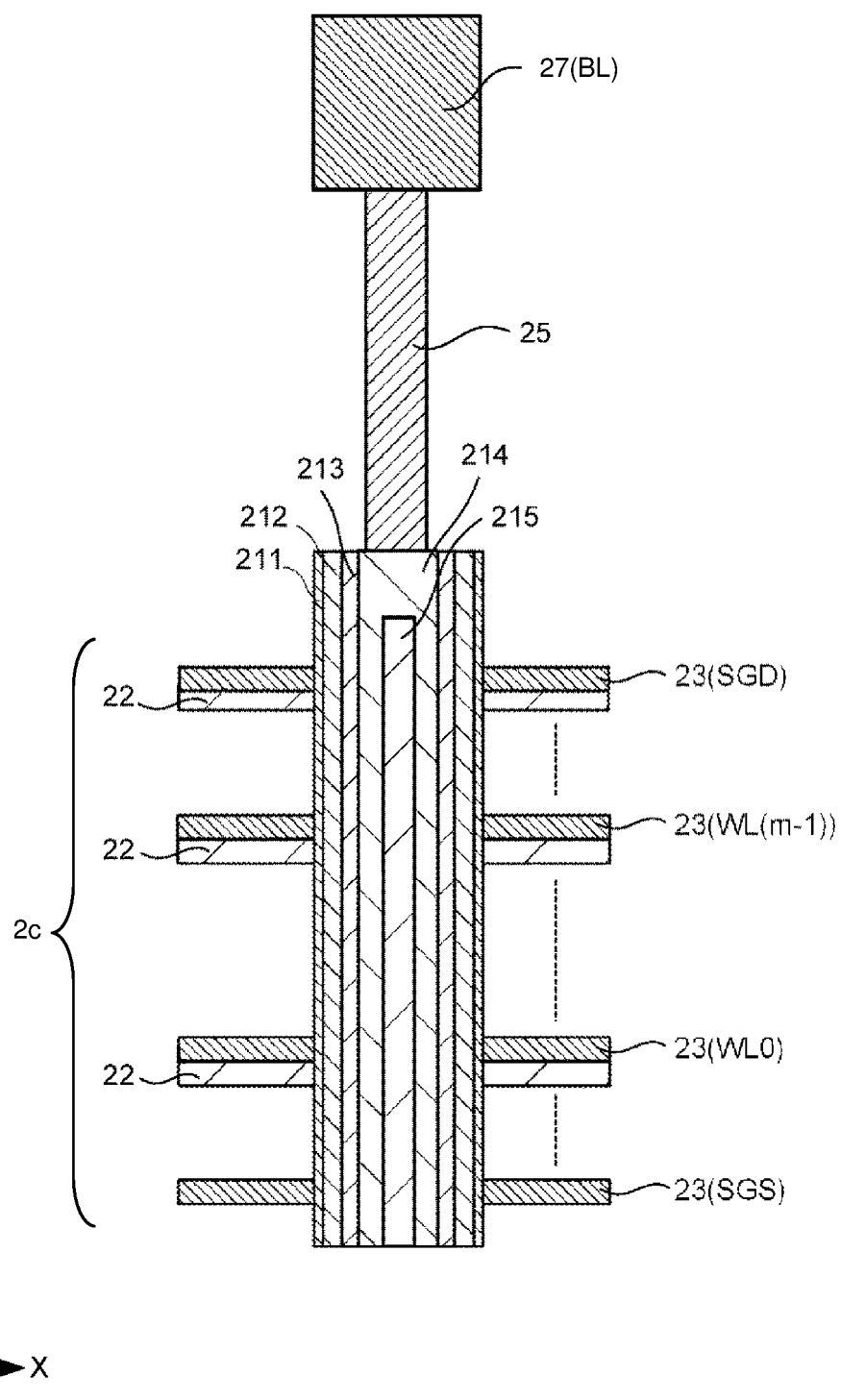
FIG. 13 depicts an example structure of a memory pillar in a schematic sectional view according to an embodiment.

FIG. 13 shows an example structure of the memory pillar MP of the memory. The memory pillar MP includes the wiring layer 23, the second inorganic compound film 22, a block insulating film 211, a charge storage film 212, a tunnel insulating film 213, a semiconductor layer 214, a core insulating layer 215, the contact layer 25, and the wiring layer 27.

The second inorganic compound films 22 and the wiring layer layers 23 are alternately stacked to constitute the stacked body 2c. In the stacked body 2c, one wiring layer 23 constitutes the select gate line SGS, another wiring layer 23 constitutes another select gate line SGD, and some other wiring layers 23 constitute the word lines WL0 to WL(m−1) between the select gate lines SGS and SGD (see also FIG. 11). The second inorganic compound film 22 contains, for example, silicon oxide. The wiring layer 23 is formed, for example, by forming the memory pillar MP, removing the first inorganic compound film 21 shown in FIG. 3 to form a cavity, and forming a conductive layer including, for example, a metal material in the cavity (that is a replacement step). The memory pillar MP extends through the stacked body 2c including the select gate line SGS, the word lines WL, and the select gate line SGD.

The block insulating film 211, the charge storage film 212, the tunnel insulating film 213, the semiconductor layer 214, and the core insulating layer 215 constitute the memory pillar MP. Each component of the memory pillar MP extends along the Z-axis direction. One memory pillar MP corresponds to one NAND string NS. The block insulating film 211, the charge storage film 212, and the tunnel insulating film 213 constitute a memory layer between the stacked body 2c and the semiconductor layer 214.

The block insulating film 211, the tunnel insulating film 213, and the core insulating layer 215 each contain, for example, silicon oxide. The charge storage film 212 contains, for example, silicon nitride. The semiconductor layer 214 contains, for example, polysilicon.

A hole corresponding to the memory pillar MP is formed through the stacked layer 2c. The block insulating film 211, the charge storage film 212, and the tunnel insulating film 213 are sequentially stacked on a side surface of the hole. Then, the semiconductor layer 214 is formed so that a side surface of the semiconductor layer 214 is in contact with the tunnel insulating film 213.

The semiconductor layer 214 is connected to the wiring layer 14 through the stacked body 2c along the Z-axis direction. The semiconductor layer 214 has a channel forming region of the select transistor ST1, the select transistor ST2, and the memory transistor MT. The semiconductor layer 214 functions as a signal line connecting current paths of the select transistor ST1, the select transistor ST2, and the memory transistor MT.

The core insulating layer 215 is provided inside the semiconductor layer 214. The core insulating layer 215 extends along the semiconductor layer 214 in the Z-axis direction.

The contact layer 25 includes a contact plug in contact with the semiconductor layer 214. The wiring layer 27 includes a bit line BL connected to the semiconductor layer 214 via another contact plug. The wiring layer 27 includes, for example, a metal material.

Each wiring layer 23 that constitutes each word line WL in the memory pillar MP constitutes the memory transistor MT. The wiring layer 23 that constitutes the select gate line SGD in the memory pillar MP constitutes the select transistor ST1. The wiring layer 23 that constitutes the select gate line SGS constitutes the select transistor ST2.

Referring back to FIG. 12, the memory cell array 200 in the first region R1 has a plurality of array portions and a plurality of stair portions, and one of the stair portions is provided between two array portions.

The dielectric layer 3A (see also FIGS. 5 to 8) can be used as a bury layer for filling the recess portion of the stair portion of the memory cell array 200. For example, the dielectric layer 3A that fills the recess portion of the stair portion is first formed, the memory pillar MP is then formed, and the replacement step is performed. The order of these steps can be altered as appropriate. The dielectric layer 3A used as the bury layer contains, for example, silicon oxide obtained by oxidizing silicon as the inorganic material 32a.

Still referring to FIG. 12, the stair portion of the memory cell array 200 in the first region R1 has the stacked body, the dielectric layer 3A, and the contact layers 26 that are electrically connected to the wiring layers 23. Each contact layer 26 is formed after the dielectric layer 3A is formed on the stacked body 2a having the stair region 2b (see FIGS. 3, 5, and 7). For example, after the replacement step, a plurality of openings are formed in the dielectric layer 3A and the openings are filled with the conductive material to form the contact layer 26.

In a case where the recess portion of the stair portion of the memory cell array 200 has a higher aspect ratio, if the bury layer that fills the recess portion is formed by, for example, a chemical vapor deposition (CVD) method, voids and cracks may occur in the bury layer. This lowers reliability of the semiconductor device and hinders increase in capacitance of the semiconductor device, e.g., the three-dimensional memory.

In the manufacturing method according to the present embodiment, the composite material including the organic material 31a and the inorganic material 32a is applied to the recess portion to form the dielectric layer 3A, and then the dielectric layer 3A is exposed to the oxidizing gas to oxidize the inorganic material 32a and remove at least part of the organic material 32a from the dielectric layer 3A. These processes form the dielectric layer 3A containing an oxide of the inorganic material 32a. As a result, the occurrence of voids and cracks in the bury layer or the dielectric layer 3A can be prevented or mitigated, and the manufactured semiconductor device achieves high reliability.

Second Embodiment

Figure 14:
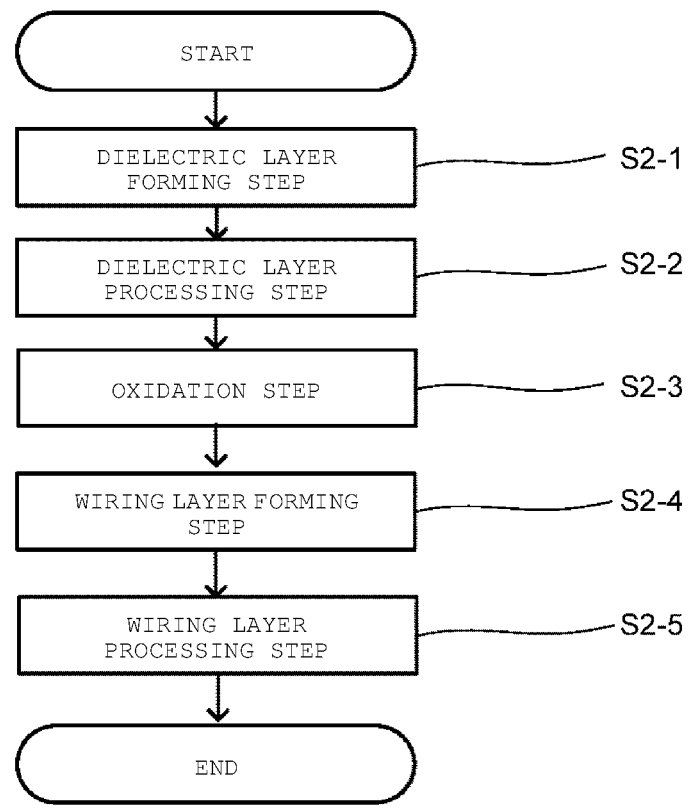
FIG. 14 is a flowchart of an example of a method for manufacturing a semiconductor device according to an embodiment.

FIG. 14 is a flowchart of an example of a method for manufacturing a semiconductor device according to a second embodiment. The manufacturing method of the second embodiment includes a dielectric layer forming step S2-1, a dielectric layer processing step S2-2, an oxidation step S2-3, a wiring layer forming step S2-4, and a wiring layer processing step S2-5.

Dielectric Layer Forming Step S2-1

Figure 15:
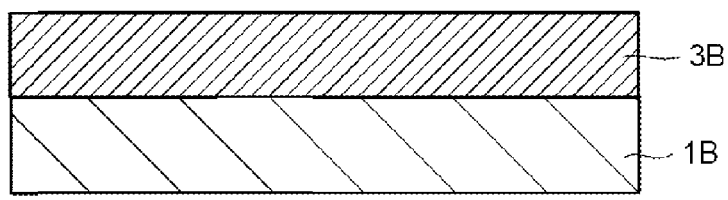
FIG. 15 depicts an example cross-section of a semiconductor device during a dielectric layer forming step according to an embodiment.

FIG. 15 shows an example X-Z cross-sectional part of a semiconductor device during the dielectric layer forming step S2-1. The X-Z cross-section includes an X-axis of an object 1B and a Z-axis orthogonal to both the X-axis and a Y-axis that is orthogonal to the X-axis. First, a dielectric layer 3B is formed on the object 1B by the dielectric layer forming step S2-1.

The object 1B includes, for example, a field effect transistor provided on a semiconductor substrate and a conductive layer provided on the field effect transistor. The field effect transistor constitutes, for example, a Complementary Metal-Oxide-Semiconductor (CMOS) circuit.

Figure 16:
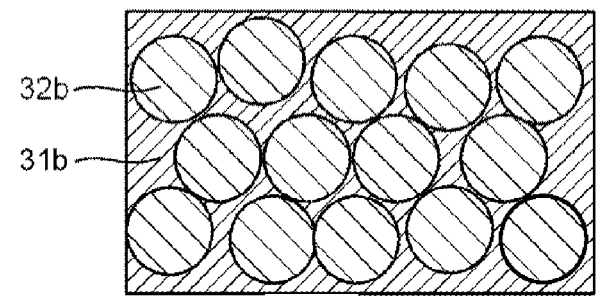
FIG. 16 depicts an example part of a dielectric layer in a dielectric layer forming step in an enlarged schematic view according to an embodiment.

FIG. 16 depicts an example part of the dielectric layer 3B in an enlarged schematic view in the dielectric layer forming step S2-1. The dielectric layer 3B includes an organic material 31b and an inorganic material 32b. The dielectric layer 3B is formed by applying or coating a composite material on an upper surface of the object 1B. The composite material includes the organic material 31b and the inorganic material 32b. The use of the composite material makes it unnecessary to add a step of impregnating the dielectric layer 3B with the inorganic material 32b.

The organic material 31b is, for example, a polymer material containing carbon and oxygen. The organic material 31b has a reaction site capable of reacting with the inorganic material 32b. The reaction site capable of reacting with the inorganic material 32b includes an unshared electron pair in which, for example, the inorganic material 32b can be coordinated, an unshared electron pair, for example, present in a functioning group such as a carbonyl group or an amide group contained in a polymer, or the like.

With respect to the dielectric layer 3B, at least the upper surface of the object 1B has fewer reaction sites than the dielectric layer 3B or has no reaction sites.

The inorganic material 32b contains at least one inorganic element selected from a group consisting of, for example, silicon, titanium, tungsten, hafnium, zirconium, and aluminum.

Dielectric Layer Processing Step S2-2

Figure 17:
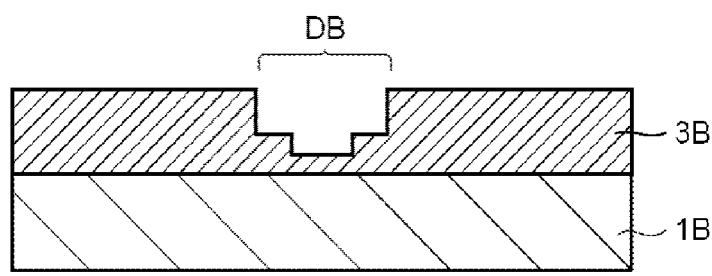
FIG. 17 depicts an example cross-section of a semiconductor device during a dielectric layer processing step according to an embodiment.
Figure 17:
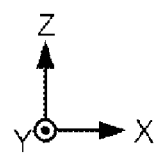
Figure 18:
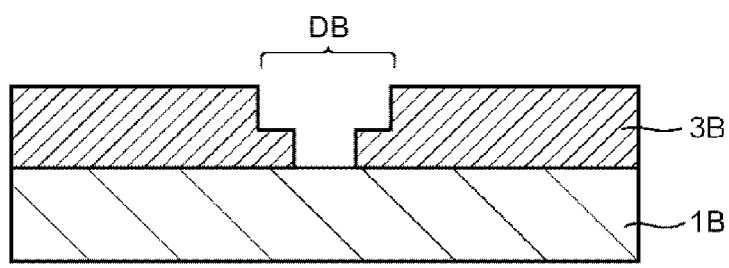
FIG. 18 depicts an example cross-section of a semiconductor device during a dielectric layer processing step S2-2 according to an embodiment.
Figure 18:
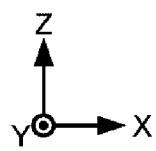

FIGS. 17 and 18 each show an example X-Z cross-sectional part of the semiconductor device including the object 1B during the dielectric layer processing step S2-2. As shown in FIG. 17, the dielectric layer 3B is processed to form a recess portion DB in the dielectric layer 3B. The recess portion DB is a trench that is used for forming a wiring layer by, for example, a dual damascene process in the present embodiment. In another embodiment, the recess portion DB may have another shape or form as appropriate. The dielectric layer 3B can be processed by using, for example, nanoimprint lithography (NIL). In a pattern forming method using the NIL, a mold (or a template) is pressed onto the dielectric layer 3B and irradiated with light to cure the dielectric layer 3B, thereby forming a pattern including the recess portion DB in the dielectric layer 3B. At this time, a part of the dielectric layer 3B remains under the recess portion DB.

Subsequently, as shown in FIG. 18, the remaining portion of the dielectric layer 3B under the recess portion DB is removed by etching a bottom portion of the recess portion DB such that the recess portion DB penetrates the dielectric layer 3B to the object 1B.

Oxidation Step S2-3

Figure 19:
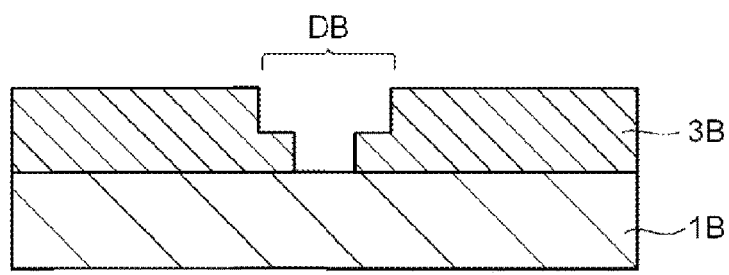
FIG. 19 depicts an example cross-section of a semiconductor device during an oxidation step according to an embodiment.
Figure 19:
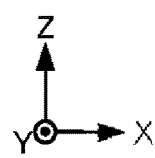
Figure 20:
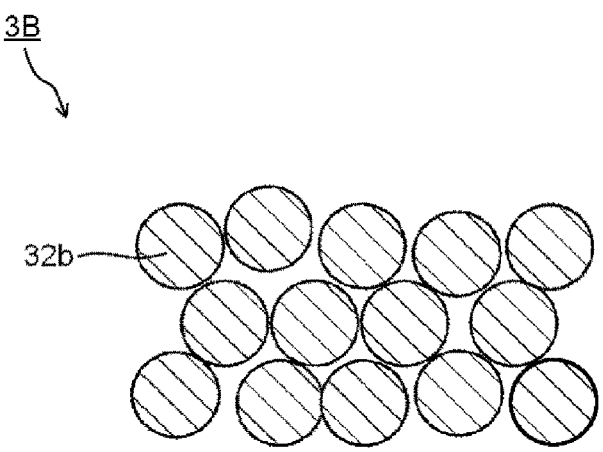
FIG. 20 depicts an example part of a dielectric layer in an oxidation step in an enlarged schematic view according to an embodiment.

FIG. 19 shows an example X-Z cross-sectional part of the semiconductor device including the object 1B during the oxidation step S2-3. FIG. 20 shows an example part of the dielectric layer 3B in the oxidation step S2-3 in an enlarged schematic view. The dielectric layer 3B is exposed to the oxidizing gas by the oxidation step S2-3. The oxidizing gas is exhausted after exposure.

The organic material 31b in the dielectric layer 3B has a reaction site that reacts with the inorganic material 32b. By exposing the dielectric layer 3B to the oxidizing gas, the oxidizing gas can oxidize the inorganic material 32b to form an oxide of the inorganic material 32b. For example, if the inorganic material 32b includes silicon, a silicon oxide film is formed. Binding energy of Si2p of the silicon oxide film at this time is, for example, $103.5 \pm 0.06$ eV.

The oxidizing gas contains, for example, ozone. Since ozone has high oxidizing power, if the oxidizing gas contains ozone, at least part of the organic material 31b is removed by exposing the dielectric layer 3B to the oxidizing gas as shown in FIG. 20. The oxide of the inorganic material 32b that remains after the organic material 31b is removed is, for example, amorphous or crystalline.

The formation of the oxide of the inorganic material 32b and the removal of the organic material 31b increase both the oxygen atom concentration of the dielectric layer 3B and the atomic concentration of silicon or metal and decrease the carbon atom concentration. The oxygen atom concentration, the carbon atom concentration, and the silicon or metal atom concentration can be measured by, for example, an X-ray photoelectron spectroscopy (XPS).

In the oxidation step S2-3, the formation of the oxide of the inorganic material 32b and the removal of the organic material 31b can form the dielectric layer 3B with the oxide of the inorganic material 32b. The density of the dielectric layer 3B formed by the oxidation step S2-3 is, for example, 1.9 g/cm$^3$ or more and 2.0 g/cm$^3$ or less.

Wiring Layer Forming Step S2-4

Figure 21:
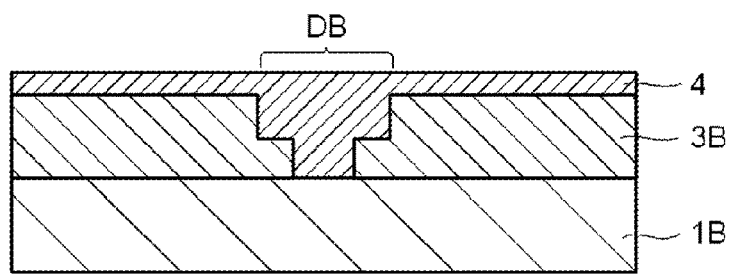
FIG. 21 depicts an example cross-section of a semiconductor device during a wiring layer forming step according to an embodiment.
Figure 21:
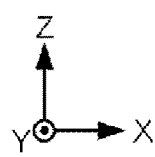

FIG. 21 shows an example X-Z cross-sectional part of the semiconductor device including the object 1B during the wiring layer forming step S2-4. As shown in FIG. 21, the wiring layer 4, with which the recess portion DB is filled, is formed by the wiring layer forming step S2-4. In one instance, the wiring layer 4 has a metal single unit or an alloy containing at least one metal of, for example, copper (Cu), ruthenium (Ru), cobalt (Co), and tungsten (W). In another instance, the wiring layer 4 may be a stack of a barrier metal layer such as titanium nitride (TiN) and another metal material layer. The wiring layer 4 is formed by, for example, sputtering.

Wiring Layer Processing Step S2-5

Figure 22:
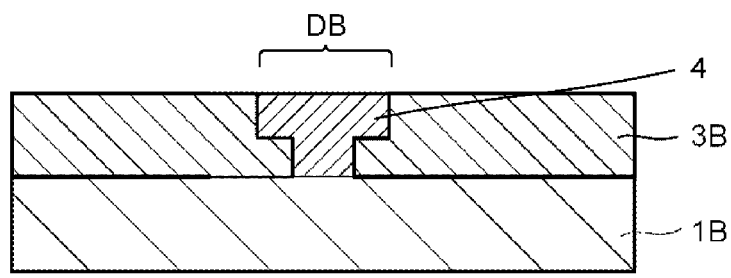
FIG. 22 depicts an example cross-section of a semiconductor device during a wiring layer processing step according to an embodiment.

FIG. 22 shows an example X-Z cross-sectional part of the semiconductor device including the object 1B during the wiring layer processing step S2-5. As shown in FIG. 22, a part of the wiring layer 4 is removed in the thickness direction until an upper surface of the dielectric layer 3B is exposed. This removal process can be performed by, for example, etching or chemical mechanical polishing (CMP).

The dielectric layer 3B formed by the manufacturing method according to the second embodiment is applicable to a memory such as a three-dimensional memory in a similar manner to the memory including the dielectric layer 3A according to the first embodiment. The overall configuration of the memory, the circuit configuration, and the structure of the memory cell are the same or substantially the same as those of the first embodiment (see, for example, FIGS. 10 to 13).

Figure 23:
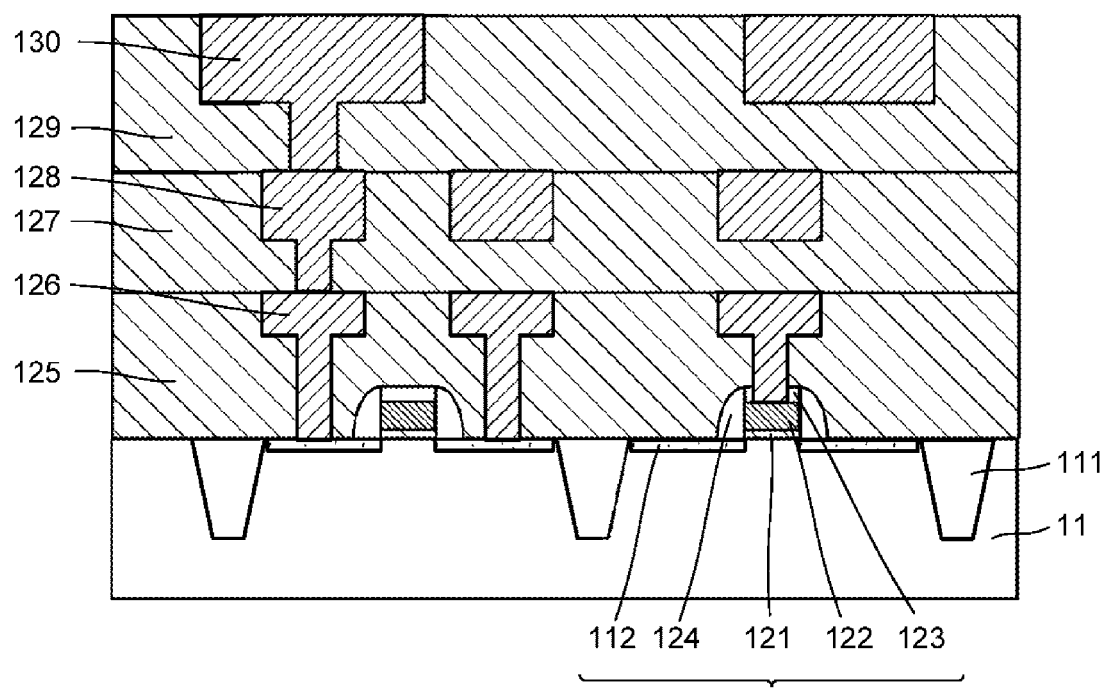
FIG. 23 depicts an example structure of a peripheral circuit region of a memory in a schematic sectional view according to an embodiment.

FIG. 23 shows an example structure of the peripheral circuit region 12 on the semiconductor substrate 11 (see FIG. 12) in a schematic sectional view in X-Z axes direction, the X-axis being along the surface of the semiconductor substrate 11, the Y-axis being substantially perpendicular to the X-axis, and the Z-axis being substantially perpendicular to the surface of the semiconductor substrate 11.

The peripheral circuit region 12 includes a plurality of field effect transistors TR, a dielectric layer 125 provided on the field effect transistors TR, a plurality of wiring layers 126 embedded in the dielectric layer 125, a dielectric layer 127 provided on the dielectric layer 125, a plurality of wiring layers 128 embedded in the dielectric layer 127, a dielectric layer 129 provided on the dielectric layer 127, and a plurality of wiring layers 130 embedded in the dielectric layer 129.

Each of the field effect transistors TR is electrically separated from other elements by a plurality of element isolation areas 111 and has an impurity region 112, a gate insulating film 121, a gate electrode 122, an insulating film 123, and an insulating layer 124. The field effect transistor TR constitutes any of the peripheral circuits such as the command register 201, the address register 202, the sequencer 203, the driver 204, the row decoder 205, and the sense amplifier 206 shown in FIG. 10.

The impurity region 112 constitutes a source region or a drain region of the field effect transistor TR. The impurity includes, for example, donor impurity or acceptor impurity. The field effect transistor TR has a channel forming region between the impurity regions 112.

The gate insulating film 121 is provided on the semiconductor substrate 11. The gate insulating film 121 includes, for example, a silicon oxide film.

The gate electrode 122 is provided on the gate insulating film 121. The gate electrode 122 has, for example, a conductive layer such as a polysilicon layer containing a doped carbon, a polysilicon layer containing doped phosphorus, a titanium layer, a metal nitride layer containing titanium nitride or tungsten nitride, or a tungsten layer. These conductive layers may be sequentially stacked to form the gate electrode 122. The gate electrode 122 is connected to one of a plurality of contact plugs.

The insulating film 123 is provided on the gate electrode 122. The insulating film 123 functions, for example, as an etching stopper when forming the contact plug on the gate electrode 122. The insulating film 123 is, for example, a silicon nitride (SiN) film.

The insulating layer 124 is provided on a side surface of the stack of the gate electrode 122 and the insulating film 123 and extends along a thickness direction of the stack. The insulating layer 124 is, for example, a silicon dioxide ($SiO_2$) layer. The insulating layer 124 functions as a sidewall of the field effect transistor TR.

The wiring layers 126, 128, and 130 are formed by, for example, the dual damascene process, and the wiring and the contact plug are integrally formed. One of the wiring layers 126 is connected to the impurity region 112 or the gate electrode 122, one of the wiring layers 128 is connected to the wiring layer 126, and one of the wiring layers 130 is connected to the wiring layer 128.

The dielectric layer 3B and the wiring layer 4 shown in FIG. 22 can be used as, for example, at least one of a combination of the dielectric layer 125 and the wiring layer 126, a combination of the dielectric layer 127 and the wiring layer 128, and a combination of the dielectric layer 129 and the wiring layer 130. The dielectric layer 3B used for these dielectric layers contains, for example, silicon oxide.

For example, if these dielectric layers are formed by a CVD method, it is necessary to perform patterning and etching on each of the deposited dielectric layers, which complicates the manufacturing step and leads to an increase in the cost of the semiconductor device.

In the manufacturing method according to the present embodiment, the dielectric layer 3B including the organic material 31b and the inorganic material 32b formed by coating is exposed to the oxidizing gas to oxidize the inorganic material 32b and at least a part of the organic material 31b is removed from the dielectric layer 3B so that the dielectric layer 3B containing the oxide of the inorganic material 32b can be formed. Therefore, it is possible to provide a low-cost semiconductor device which has high reliability and for which the manufacturing process is simplified.

Modified Example of Method for Manufacturing Semiconductor Device

Figure 24:
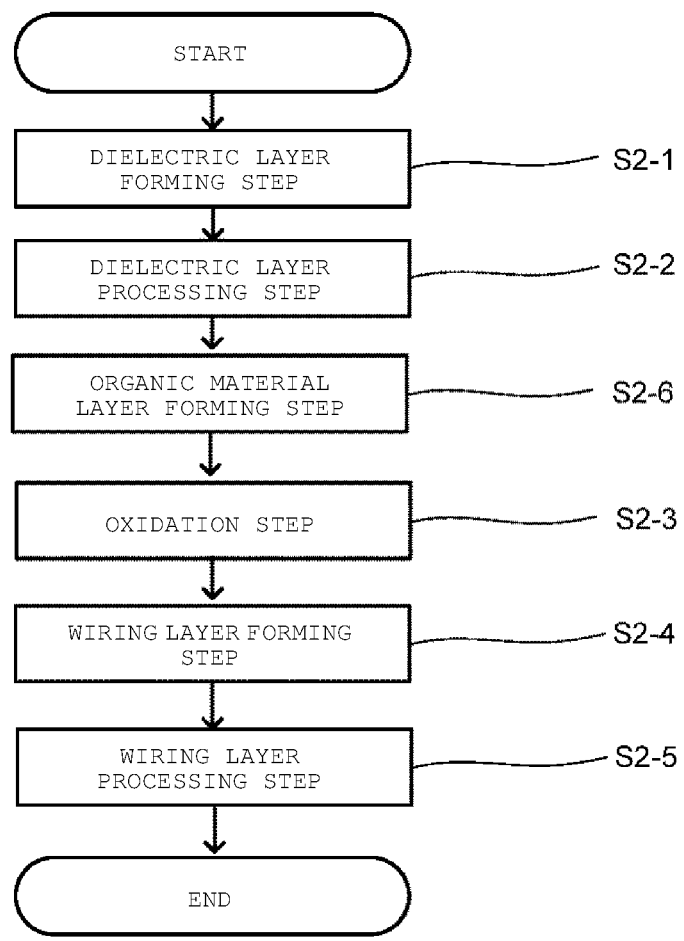
FIG. 24 is a flowchart of a modified example of a method for manufacturing a semiconductor device according to an embodiment.

FIG. 24 is a flowchart of a modified example of the method for manufacturing a semiconductor device of the second embodiment. The modified example of the manufacturing method includes a dielectric layer forming step S2-1, a dielectric layer processing step S2-2, an oxidation step S2-3, a wiring layer forming step S2-4, and a wiring layer processing step S2-5 and further includes an organic material layer forming step S2-6 after the dielectric layer processing step S2-2 and before the oxidation step S2-3. The dielectric layer forming step S2-1, the dielectric layer processing step S2-2, the wiring layer forming step S2-4, and the wiring layer processing step S2-5 are the same as those shown in FIG. 14.

Organic Material Layer Forming Step S2-6

Figure 25:
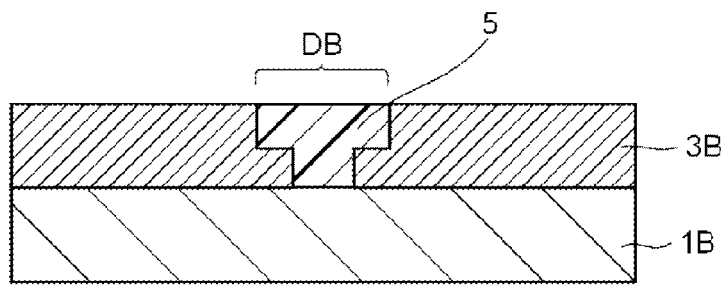
FIG. 25 depicts an example cross-section of a semiconductor device during an organic material layer forming step according to an embodiment.
Figure 25:
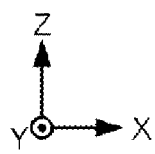

FIG. 25 shows an example X-Z cross-sectional part of the semiconductor device including the object 1B during the organic material layer forming step S2-6. As shown in FIG. 25, the organic material layer 5, with which the recess portion DB is filled, is formed by the organic material layer forming step S2-6.

The organic material layer 5 is, for example, a polymer material that contains carbon and oxygen like the organic material 31b but does not include the inorganic material 32b. The organic material layer 5 has fewer reaction sites than the dielectric layer 3B or has no reaction sites that can react with the inorganic material 32b.

The organic material layer 5 firmly adheres to the dielectric layer 3B. The organic material layer 5 is formed by applying or coating the polymer material to the recess portion DB. Further, for example, a surface of the organic material layer 5 is processed by a surface treatment such as etching or CMP so as to be flush with the surface of the dielectric layer 3B. In another instance, the organic material layer may be formed, for example, by a spin coating method.

Oxidation Step S2-3

Figure 26:
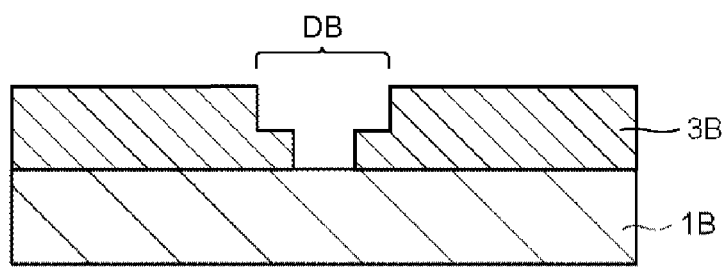
FIG. 26 depicts an example cross-section of a semiconductor device during an oxidation step according to an embodiment.

FIG. 26 shows an example X-Z cross-sectional part of the semiconductor device including the object 1B during the oxidation step S2-3. The dielectric layer 3B and the organic material layer 5 are exposed to the oxidizing gas by the oxidation step S2-3. The oxidizing gas is exhausted after exposure.

In the oxidation step S2-3, the dielectric layer 3B can be formed of the oxide of the inorganic material 32b by forming the oxide of the inorganic material 32b and removing at least part of the organic material 31b and the organic material layer 5. Further, the organic material layer 5 is removed by being exposed to the oxidizing gas together with the dielectric layer 3B. Other descriptions or features of the oxidation step S2-3 are the same as those of the oxidation step S2-3 shown in FIG. 14.

The dielectric layer 3B may expand due to oxidation of the inorganic material 32b, and a compressive stress may be generated in the dielectric layer 3B. However, the organic material layer 5 does not expand because it does not include the inorganic material 32b and has fewer reaction sites than the dielectric layer 3B or no reaction sites. Therefore, a size of the recess portion DB is maintained. Further, since the organic material layer 5 firmly adheres to the dielectric layer 3B, it is difficult to peel off from the dielectric layer 3B even if the dielectric layer 3B expands. Therefore, deformation of a pattern due to expansion of the dielectric layer 3B can be prevented or mitigated. As a result, it is possible to provide a semiconductor device with high reliability.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modified examples as would fall within the scope and spirit of the disclosure.

What is claimed is:

1. A method for manufacturing a semiconductor device, comprising:
    alternately stacking a first film and a second film on an object to form a multilayer film stack;
    forming a stacked body and a recess by removing portions of the multilayer film stack;
    forming a dielectric layer by applying a composite material to the recess such that the recess is filled with the dielectric layer, the composite material comprising an inorganic material and an organic material;
    exposing the dielectric layer to an oxidizing gas to oxidize the inorganic material and to remove at least part of the organic material from the dielectric layer.

2. The method according to claim 1, wherein the inorganic material includes at least one element selected from the group consisting of silicon, titanium, tungsten, hafnium, zirconium, and aluminum.

3. The method according to claim 1, wherein an aspect ratio of the recess is 0.6 or more.

4. The method according to claim 1, wherein the oxidizing gas contains ozone.

5. The method according to claim 1, wherein a density of the dielectric layer is between 1.9 g/cm$^3$ and 2.0 g/cm$^3$ after the exposing of the dielectric layer to the oxidizing gas.

6. The method according to claim 1, wherein the object comprises a semiconductor substrate.

7. The method according to claim 1, wherein the first film is a sacrificial layer, and the second film is an insulating layer.

8. A method for manufacturing a semiconductor device, comprising:
    coating a composite material on a semiconductor substrate to form a dielectric layer, the composite material including an inorganic material and an organic material;
    removing a part of the dielectric layer to form a recess, the recess penetrating the dielectric layer to a surface of the semiconductor substate;
    exposing the dielectric layer to an oxidizing gas to oxidize the inorganic material and to remove at least part of the organic material, the oxidizing gas containing ozone; and
    filling the recess with a conductive material.

9. The method according to claim 8, wherein the recess has stair-stepped sidewalls.

10. The method according to claim 8, wherein a density of the dielectric layer is between 1.9 g/cm$^3$ and 2.0 g/cm$^3$ after the exposing of the dielectric layer to the oxidizing gas.

* * * * *